United States Patent
Vrysas et al.

(10) Patent No.: US 11,424,725 B2
(45) Date of Patent: Aug. 23, 2022

(54) DIGITAL POWER AMPLIFIER WITH FILTERED OUTPUT

(71) Applicant: ARGO SEMICONDUCTORS FS LTD (HE 359654), Nicosia (CY)

(72) Inventors: Konstantinos Vrysas, Petoupoli (GR); Emmanouil Frantzeskakis, Elioupoli (GR); Georgios Sfikas, Glyfada (GR)

(73) Assignee: ARGO SEMICONDUCTORS FS LTD (HE 359654), Nicosia (CY)

( * ) Notice: Subject to any disclaimer, the term of this patent is extended or adjusted under 35 U.S.C. 154(b) by 0 days.

(21) Appl. No.: 17/253,161

(22) PCT Filed: Aug. 1, 2018

(86) PCT No.: PCT/CY2018/000002
§ 371 (c)(1),
(2) Date: Dec. 17, 2020

(87) PCT Pub. No.: WO2020/025070
PCT Pub. Date: Feb. 6, 2020

(65) Prior Publication Data
US 2021/0273618 A1    Sep. 2, 2021

(51) Int. Cl.
*H03F 3/24* (2006.01)
*H04B 1/04* (2006.01)

(52) U.S. Cl.
CPC .............. *H03F 3/245* (2013.01); *H04B 1/04* (2013.01); *H03F 2200/451* (2013.01); *H03F 2203/21145* (2013.01); *H03F 2203/21157* (2013.01)

(58) Field of Classification Search
CPC ... H03F 1/32; H03F 3/217; H03F 1/30; H03F 2203/21145; H03F 2203/21157; H03M 1/66; H04B 2001/0408
See application file for complete search history.

(56) References Cited

U.S. PATENT DOCUMENTS 9,065,472 B1 *  6/2015  McCue ................ H03M 3/404
2007/0140382 A1 *  6/2007  Qian ........................ H04B 1/30
                                                                        329/304

(Continued)

OTHER PUBLICATIONS

Alavi et al, "A Wideband 2×13-bit All-Digital I/Q RF-DAC", IEEE Transactions on Microwave Theory and Techniques, vol. 62, No. 4, Apr. 2014 (Year: 2014).*

(Continued)

*Primary Examiner* — Aristocrats Fotakis
(74) *Attorney, Agent, or Firm* — Mark M. Friedman

(57) ABSTRACT

The present invention, a Digital Power Amplifier (DPA) with filtered output relates to the transmission circuitry of wireless communications systems and more particularly to high frequency power amplifier circuits using digital intensive techniques on cost efficient semiconductor technologies. Today, we experience an ever-increasing need for low cost, low power wireless transmitters in the millimeter wavelength region. Current solutions rely on analog PA circuits. The background art does not contain a solution for bridging the gap between the operation frequencies of the digital circuits on a cost-efficient technology such as CMOS and the millimeter wavelength transmission frequencies demanded in numerous applications. The DPA allowing the direct feeding of digital data to a high frequency amplifying circuit. In this way, design challenging and costly analog processing up-conversion stages are avoided. The DPA comprises a bank of switching amplifying elements, a switch capacitor trap filter taping on the bank of switching amplifying elements for shaping the frequency characteristic of the produced radio frequency (RF) waveform and an adaptive biasing circuit able of dynamically controlling the power consumption within the switching amplifying elements. It can have a wide spectrum of applications where (Continued)

low cost but high efficiency power amplifiers are needed, such as in the Internet of Things (IoT), Wi-Fi and 5G cellular communications.

10 Claims, 6 Drawing Sheets

(56) References Cited

U.S. PATENT DOCUMENTS

| | | | | |
|---|---|---|---|---|
| 2008/0090531 | A1* | 4/2008 | Jungerman | H04L 27/364 |
| | | | | 455/126 |
| 2013/0010851 | A1* | 1/2013 | Jaeger | H04B 17/0085 |
| | | | | 375/224 |
| 2014/0159933 | A1* | 6/2014 | Dufrene | H03M 1/0612 |
| | | | | 341/144 |
| 2014/0162576 | A1 | 6/2014 | Dufrene | |
| 2014/0355717 | A1 | 12/2014 | Lu | |
| 2015/0155893 | A1* | 6/2015 | Winoto | H04L 7/02 |
| | | | | 375/306 |
| 2015/0180418 | A1* | 6/2015 | Maeda | H04L 25/03 |
| | | | | 375/297 |
| 2018/0131398 | A1* | 5/2018 | Shiu | H04L 25/03 |
| 2018/0198661 | A1* | 7/2018 | Palmers | H03M 1/1047 |
| 2020/0112471 | A1* | 4/2020 | Mehrpoo | H04B 1/04 |

OTHER PUBLICATIONS

Hashemi et al, An Intrinsically Linear Wideband Polar Digital Power Amplifier, IEEE Journal of Solid-State Circuits, vol. 52, No. 12, Dec. 2017 (Year: 2017).*

Mehrpoo et al, A wideband linear direct digital RF modulator using harmonic rejection and I/Q-interleaving RF DACs, 2017 IEEE Radio Frequency Integrated Circuits Symposium (RFIC), Jun. 2017 (Year: 2017).*

Seyed Morteza Alavi, All-Digital I/Q RF-DAC, Thesis, University of Tehran, Iran, 2014 (Year: 2014).*

International Search Report of PCT/CY2018/000002, dated Jan. 30, 2019.

* cited by examiner

US 11,424,725 B2

DIGITAL POWER AMPLIFIER WITH FILTERED OUTPUT

TECHNICAL FIELD

The present invention relates in general to the transmission circuitry of wireless communications systems and more particularly, to high frequency power amplifier circuits using digital intensive techniques on cost efficient semiconductor technologies.

BACKGROUND ART

Broadband communications performance requirements continue to push the limits of digital-based technical solutions even in areas traditionally dominated by analog circuits such as the Power Amplifiers (PA). The design of digital PA (DPA) circuits is very challenging especially for high frequency applications, where the processing of sampled data sequences in the multi-GHz frequencies is required. The ability of the new generation of digital-to-analog converters (DACs) to convert from a digital signal directly into L, S, or even C band (6 GHz) can be seen as a large step in capability allowing greater system flexibility and reduction in power consumption. Multiple up-mixers that would normally have been required can now be deleted, along with the VCO/PLL jitter, which adds at every up-conversion.

The DPA was first introduced in 2005 as a concept by Staszewski et al. ("All-digital PLL and transmitter for mobile phones," IEEE J. Solid-State Circuits, vol. 40, no. 12, pp. 2469-2482, December 2005). In the U.S. Pat. No. 8,675,725 (Staszewski et al., "Integrated circuit, communication unit and method for improved amplitude resolution of an RF-DAC", Mar. 18, 2014) a DPA comprises a plurality of selectable switching devices capable of adjusting an envelope of the RF carrier and a pulse width modulator (PWM) generator arranged to generate a PWM control signal controlling the plurality of the selectable DPA switching devices. In U.S. Pat. No. 7,460,612 (Oren E. Eliezer et. al., "Method and apparatus for a fully digital quadrature modulator") a complex modulator effectively operates as a complex digital-to-analog converter where the digital inputs are given in Cartesian form, namely as in-phase (I) and quadrature (Q) components representing the complex number I-Q, while the produced output is a modulated RF signal with appropriate amplitude and phase shift. The phase shift is defined with respect to a reference phase dictated by a local oscillator, which is also fed to the converter/modulator. In US 2014/0254720 (Zhiming Deng et al., "PA cell, PA module, wireless communication unit, RF transmitter architecture and method therefor", Sep. 11, 2014) the basic DPA functionality is presented including a bank of switching amplifying elements. This has also been combined with a cartesian loop linearization method, following the example of analog PA linearization. In addition, a technique for cell sharing between the two processing paths associated to the real component and the imaginary component of a complex digital input signal has been described. In U.S. Pat. No. 8,981,845 (David M. Signoff, et al., "Digital power amplifier", Mar. 17, 2015) an efficiency improvement architecture that has been used extensively in analog PA design, namely the Doherty PA architecture, has been used in a DPA context. In U.S. Pat. No. 7,834,686 (Staszewski et al., "Power amplifier", Nov. 16, 2010) multiple banks of switching amplifying elements are used producing signals that are combined in the RF domain in an inductive way. As a result, a finite impulse response (FIR) effect is achieved, applicable to narrow-band transmit signals. A thorough survey on the Power Amplifier topic has been presented by Hua Wang et al. ("The Wireless Workhorse", IEEE Microwave Mag., October 2015).

DISCLOSURE OF INVENTION

To the knowledge of the inventors, the background art does not provide a solution for bridging the gap between the operation frequencies of the digital circuits on a cost-efficient technology such as CMOS and the millimeter wavelength transmission frequencies demanded in numerous applications. Therefore, analog processing up-conversion stages are utilized for addressing this issue but these are technically challenging and costly.

The present invention concerns a DPA circuit that allows the use of a data sampling frequency that is lower than the transmitter carrier frequency. More specifically, the mismatch between the carrier frequency and the sampling frequency of the digital data to be transmitted implies the generation of unwanted spurious byproducts. These byproducts are suppressed by the introduction of appropriate filtering techniques. The DPA comprises a bank of switching amplifying elements, a switch capacitor trap filter taping on the bank of switching amplifying elements for shaping the frequency characteristic of the produced radio frequency (RF) waveform and an adaptive biasing circuit able of dynamically controlling the power consumption within the switching amplifying elements.

BEST MODE FOR CARRYING OUT THE INVENTION

Figure 1:
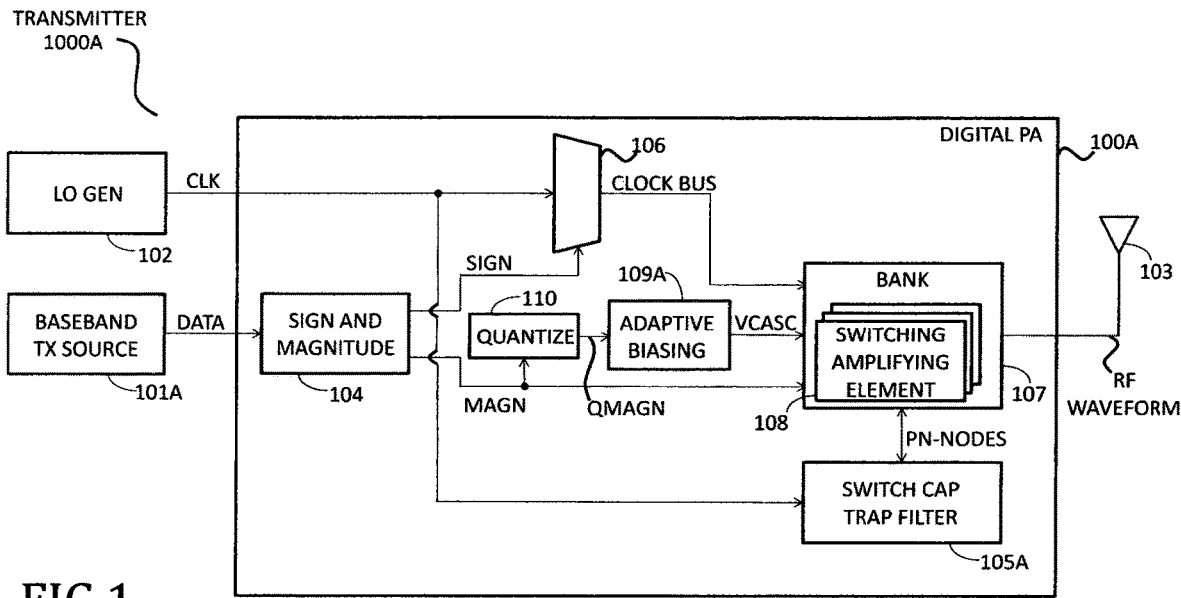
FIG. 1 shows a DPA circuit with output filtering according to the invention.

A diagrammatic representation of an exemplary widget concerning a Digital PA (DPA) where one can deploy the applied for invention is shown in FIG. 1. A baseband TX source 101A produces an information data sequence DATA, while a local oscillation signal generator (LO gen) 102 produces a clock signal CLK. The clock signal has a frequency FC, it may have a duty cycle of 50% or 25% and it may be a single-ended clock or a differential clock, that is a pair of clock signal components with mirrored amplitude values. The information sequence comprises real valued samples at a frequency FS, quantized at a finite number of levels, for example $N=2^n$ levels. The clock signal CLK and the information sequence are fed to a DPA circuit 100A producing an RF WAVEFORM signal to be transmitted over an antenna 103.

Within the DPA circuit 100A, a sign-and-magnitude circuit 104 splits the data sequence into a sign sequence SIGN and a magnitude sequence MAGN. A mux circuit 106 inverts the polarity of the clock depending on the instantaneous value of the SIGN signal and it produces a CLOCK BUS signal. A QUANTIZE circuit 110 maps the sample values of the magnitude sequence MAGN to a reduced number of levels, for example K levels with K<N, to produce a sequence QMAGN. A sample in QMAGN is represented by a K-bit digital word. An adaptive biasing circuit 109A produces a bias voltage VCASC in response to the sequence QMAGN. Since QMAGN depends on the information data sequence DATA, it follows that the adaptive biasing circuit 109A is responsive to DATA. A bank of switching amplifying elements 107 comprises a number of identical amplifying elements 108, for example with multitude equal to the multitude of the magnitude sample levels N. In this case, the value of a magnitude sample dictates the number of switching amplifying elements that are turned on for a period of time equal to 1/FS. The circuit 107 receives as input the CLOCK BUS, the voltage bias and the magnitude sequence in thermo-coded representation and it produces the RF WAVEFORM signal. Also, it is connected with a switch cap trap filter 105A via a differential signal PN-NODES. The circuit 105A also receives as input the CLK signal. In the thermo-coded representation of the input data each sample is represented with N bits and its value is expressed by the number among these bits that are set to one.

Figure 2:
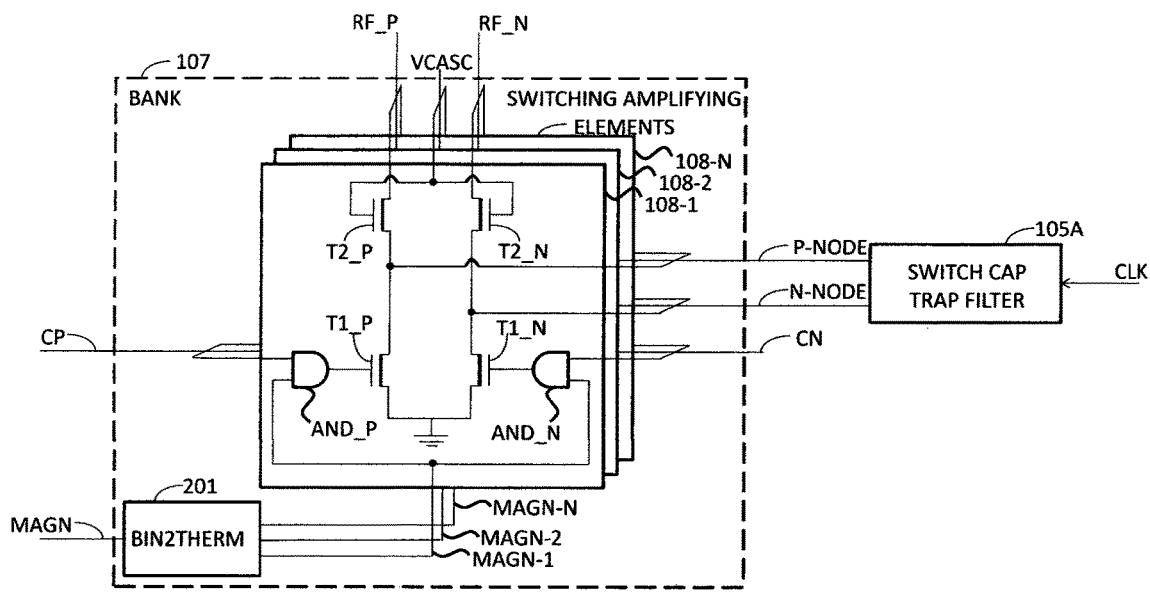
FIG. 2 shows the details of a bank of switching amplifying elements, which is part of the invention

FIG. 2 shows an exemplary diagrammatic representation of the bank circuit 107 of N switching amplifying elements 108-1, 108-2, . . . , 108-N. A binary-to-thermal circuit (BIN2THERM) 201 maps eats sample of the MAGN sequence onto an array of binary values MAGN-1, MAGN-2, . . . , MAGN-N of length N, where the number of ones within this array are dictated by the value of the input sample. The resulted $i^{th}$ magnitude bit MAGN-i is fed to the $i^{th}$ switching amplifying element 108-i. The $i^{th}$ element 108-i also receives as input the differential components CP and CN of the CLOCK BUS, as well as the voltage bias VCASC. The differential clock gates the magnitude bit with a pair of AND gates, AND_P and AND_N that control a pair of switch transistor circuits T1_P and T1_N respectively. A pair of cascode or current source transistor circuits T2_P and T2_N are connected in series with the switching transistors while their gates are controlled by VCASC. This aims to receiving a dynamically variable voltage at their gates controlling the current flowing through the pair of transistors T1_P and T2_P, or T1_N and T2_N. The node connecting the pair of transistors T1_P and T2_P are tapped from every switching amplifying element to be connected together in order to form the P-NODE signal. Similarly, the node connecting the pair of transistors T1_N and T2_N are tapped from every switching amplifying element to be connected together in order to form the N-NODE signal. The P-NODE and the N-NODE signals are communicated with the switch cap trap filter 105A. The other ports of the switching transistors are grounded, while the other ports of the cascode transistors are contributing their current to the differential components RF_P and RF_N of the RF WAVEFORM signal.

Figure 3:
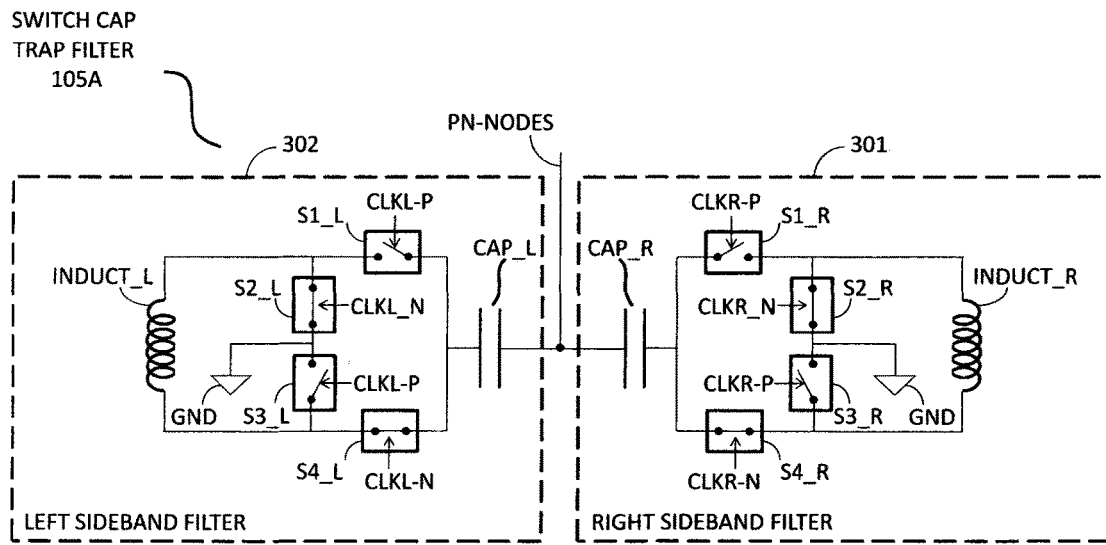
FIG. 3 shows a switch capacitor trap filter employing passive inductor, which is another part of the invention.

FIG. 3 shows an exemplary diagrammatic representation of the switch cap trap filter 105A. This filter comprises a right sideband filter circuit 301 and a left sideband filter circuit 302 intending to eliminate spur signals that may appear at symmetric frequency locations around FC, for example at the frequencies FC+FS and FC−FS. The circuit 301 comprises a capacitor CAP_R, an inductor INDUCT_R and a quadruple of switches S1_R through S4_R, collectively forming an electric network exhibiting a band-stop frequency response (notch). The capacitor CAP_R is connected to the differential signal PN-NODES coming from the bank 107 of switching amplifying elements. The quadruple of switches forms a ring structure and the switches are controlled by a differential clock CLKR. The first component CLKR-P of the differential clock is used to switch on and off the switches S1_R and S3_R, while the second component CLKR-N of the differential clock is used to switch on and off the switches S2_R and S4_R. The node between S2_R and S3_R is grounded. The frequency of the differential clock may be FC or FC+FS. However, the values of the capacitor, the inductor and the frequency of the differential clock are chosen so that the band-stop characteristic is centered around a desired frequency value, for example FC+FS. The circuit 302 may have a structure identical to the one of 301, comprising a capacitor CAP_L, an inductor INDUCT_L and a quadruple of switches S1_L through S4_L. It receives as input a differential clock CLKL with components CLKL-P and CLKL-N and its frequency may take the value of FC or FC−FS. The clocks of frequency FC may be tapped at the output of 102.

Figure 4:
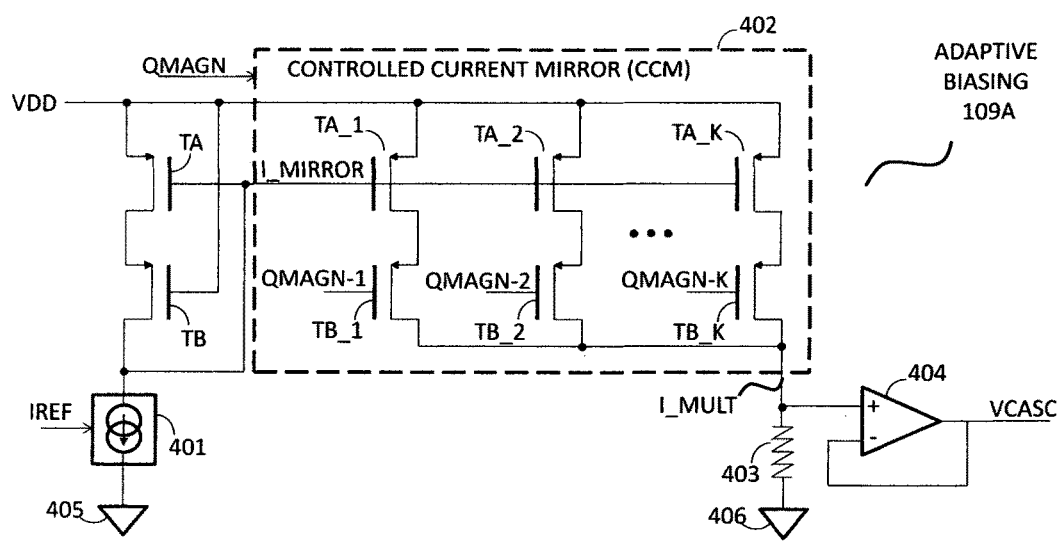
FIG. 4 shows an adaptive biasing circuit for DPA employing a switch capacitor trap filter with passive inductor, which is a further part of the invention

FIG. 4 shows an exemplary diagrammatic representation of the adaptive biasing circuit 109A. The circuit 109A receives as input the sequence of K-bit thermo-coded digital words QMAGN and it comprises a current source 401, a pair of transistors TA and TB connected in series, a controlled current mirror circuit (CCM) 402 and an operational amplifier 404, collectively forming an electric network producing an output voltage value proportional to the input digital word. The current source 401 generates a current fed to the gates of the K first transistors in CCM in response to a reference current IREF. 401 is grounded on 405. The controlled current mirror circuit 402 comprises K pairs of transistors TA_1 and TB_1, TA_2 and TB_2, . . . , TA_K and TB_K connected in series, where the gates of all the first transistors are connected together and the gate of each one of the K second transistors is switched on and off in response to one of the K bits of the input digital word QMAGN-1, QMAGN-2, . . . , QMAGN-K. The current I_MULT produced at the output of the CCM circuit 402 by grounding to 406 via a resistor 403 is fed to the operational amplifier 404 that is connected in buffer configuration to produce the voltage output VCASC.

The above is the best mode for carrying out the invention. Additional embodiments are described herein below and mainly provide the details of different variations of the best mode for carrying out the invention described above.

Figure 5:
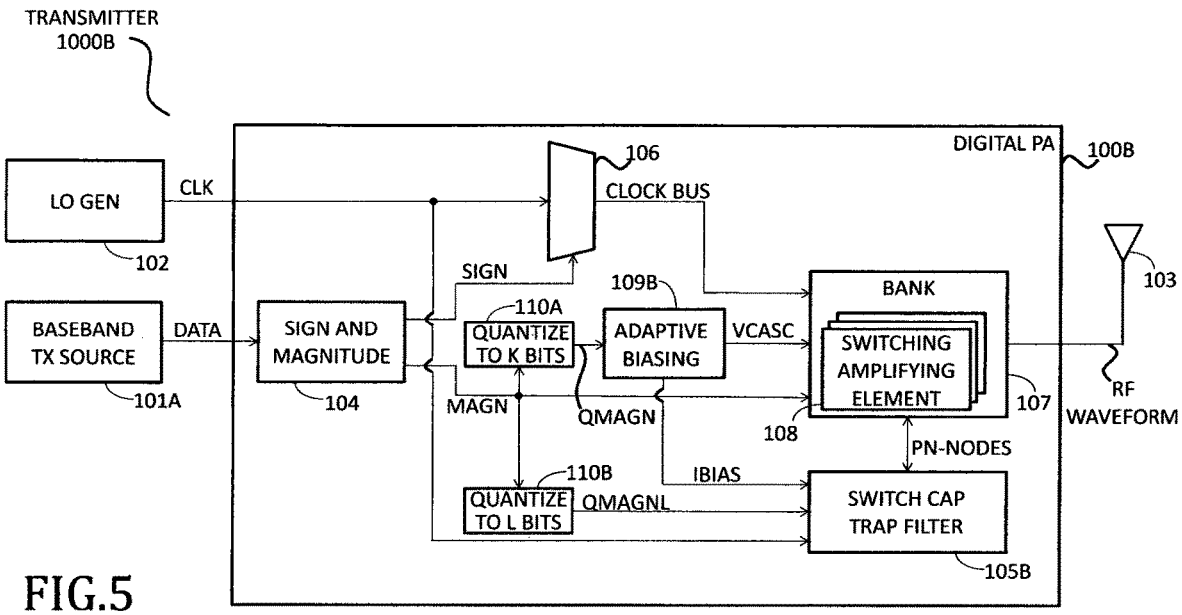
FIG. 5 shows an embodiment of the invention employing a switch capacitor trap filter based on an active inductor.

FIG. 5 shows another embodiment of the invention employing a DPA circuit 100B, where an adaptive biasing circuit 109B produces a bias voltage VCASC and a multitude of bias currents IBIAS in response to the sequence QMAGN. The voltage VCASC is fed to the bank of switching amplifying elements 107, while the currents IBIAS are fed to the switch capacitor trap filter. Also, the DPA 100B comprises two quantizer circuits, a QUANTIZE TO K BITS circuit 110A and a QUANTIZE TO L BITS circuit 110B. The circuit 110A produces a quantized version QMAGN of the magnitude signal MAGN to be fed to the bank of switching amplifying elements 107, while the circuit 110B produces a quantized version QMAGNL of the magnitude signal MAGN to be fed to a switch cap trap filter 105B. Feeding the signals IBIAS and QMAGNL to the switch cap trap filter 105B allows a dynamic control of the switching activity in the circuit 105B and therefore the control of its power consumption as function of the dynamically varying input signal.

Figure 6:
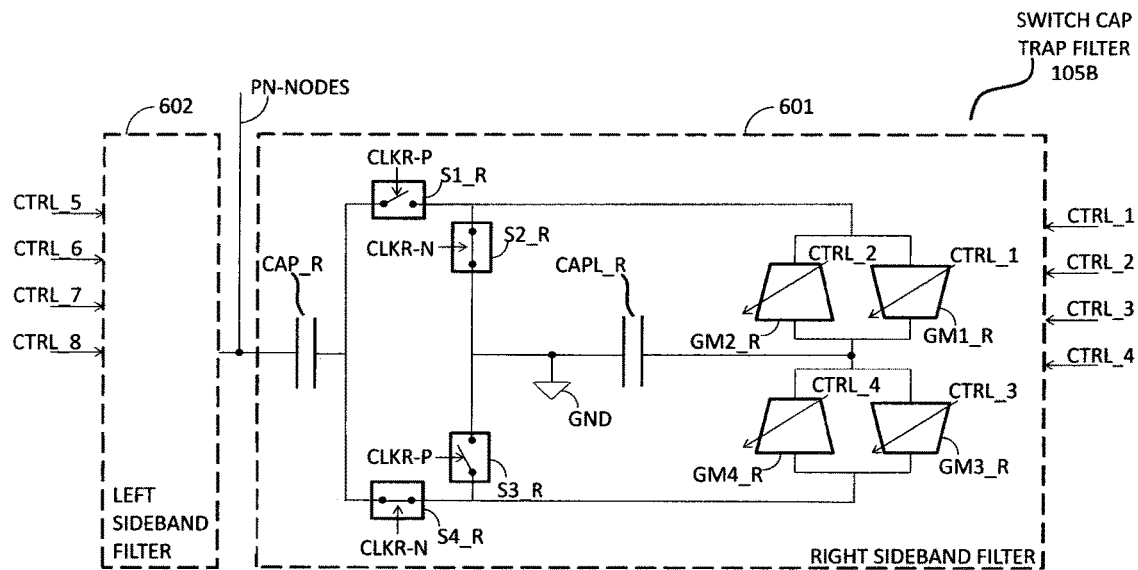
FIG. 6 shows the details of the switch capacitor trap filter of the invention embodiment in FIG. 5.

FIG. 6 shows another exemplary diagrammatic representation of the switch cap trap filter 105B comprising an active inductance circuit built around a network of gyrators. This filter comprises a right sideband filter circuit 601 and a left sideband filter circuit 602 intending to eliminate spur signals that may appear at symmetric frequency locations around FC, for example at the frequencies FC+FS and FC−FS. The circuit 601 comprises a capacitor CAP_R and a quadruple of switches S1_R through S4_R following the layout described in relation to FIG. 3. The circuit 601 also comprises two pairs of gyrators GM1_R, GM2_R and GM3_R, GM4_R connected in series, the gyrators within each pair connected back-to-back. Also, a grounded capacitor CAPL_R is also attached at the series connection point of the two pairs of gyrators. The four gyrators are controlled by four control signals CTRL_1 though CTRL_4. The circuit 602 may have a structure identical to the one of 601, comprising capacitors CAP_L and CAPL_L, a quadruple of switches S1_L through S4_L and a quadruple of gyrators GM1_L through GM4_L controlled by the signals CTRL_5 through CTRL_8 respectively. It receives as input a differential clock CLKL with components CLKL-P and CLKL-N and its frequency may take the value of FC or FC−FS. The clocks of frequency FC may be tapped at the output of 102.

Figure 7:
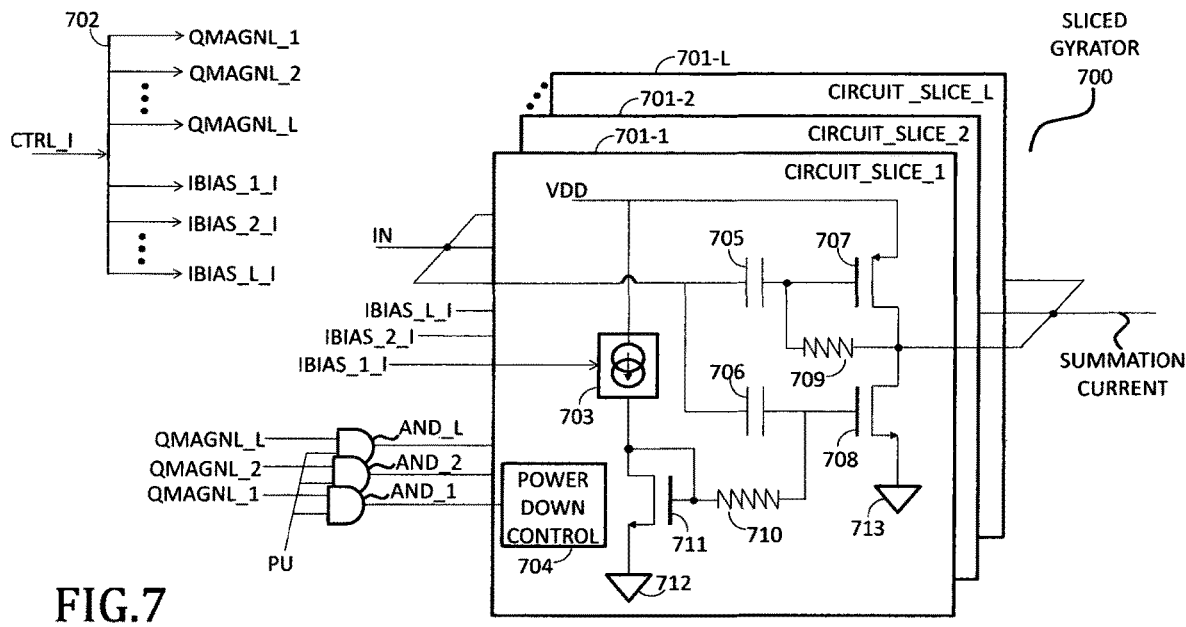
FIG. 7 provides an exemplary outline of a sliced gyrator circuit appropriate for the switch capacitor trap filter detailed in FIG. 6.

FIG. 7 shows an exemplary diagrammatic representation of a gyrator circuit 700 comprising a multitude of L identical gyrator circuit slices SLICE_1 (701-1) thought SLICE_L (701-L), where L may range between 1 and K. Each gyrator slice produces a current, all slices collectively produce a summation current. The gyrator is controlled by the control signal CTRL_I following a decomposition 702 into a multitude of L binary signals QMAGNL_1 through QMAGNL_L produced by circuit 110B and a multitude of L bias currents IBIAS_1_I through IBIAS_L_I produced by the adaptive bias circuit 109B. The said L binary signals form an L-bit thermo-coded digital control word that may be gated with a power up control flag PU by an array of AND gates AND_1 trough AND_L. The binary output signal of each AND gate may control the POWER DOWN CONTROL circuit 704 of a gyrator slice switching on and off the power on the gyrator circuit slice. Each gyrator circuit slice also comprises a current source 703 controlled by a bias current, 703 being attached to the voltage supply VDD and grounded via a transistor 711. A gyrator slice also comprises a pair of transistors 707 and 708 connected in series and producing an output current tapped on the connection point of the two transistors, contributing to the summation current, 707 also attached to the voltage supply VDD and 708 grounded to 713. A gyrator slice also comprises a pair of capacitors 705 and 706 both connected at the gyrator input and each one also connected to the gate of 707 and 708 respectively. It also comprises a pair of resistors 709 and 710, one port of 709 being attached to the connecting point between 705 and 707, the other port of 709 being attached to the output point, one port of 710 being attached to the connecting point between 706 and 708, the other port of 710 being attached to the gate of 711, as well we the connecting point between 703 and 711.

In the gyrator circuit 700, the gyrator can consist of exactly one gyrator slice.

Figure 8:
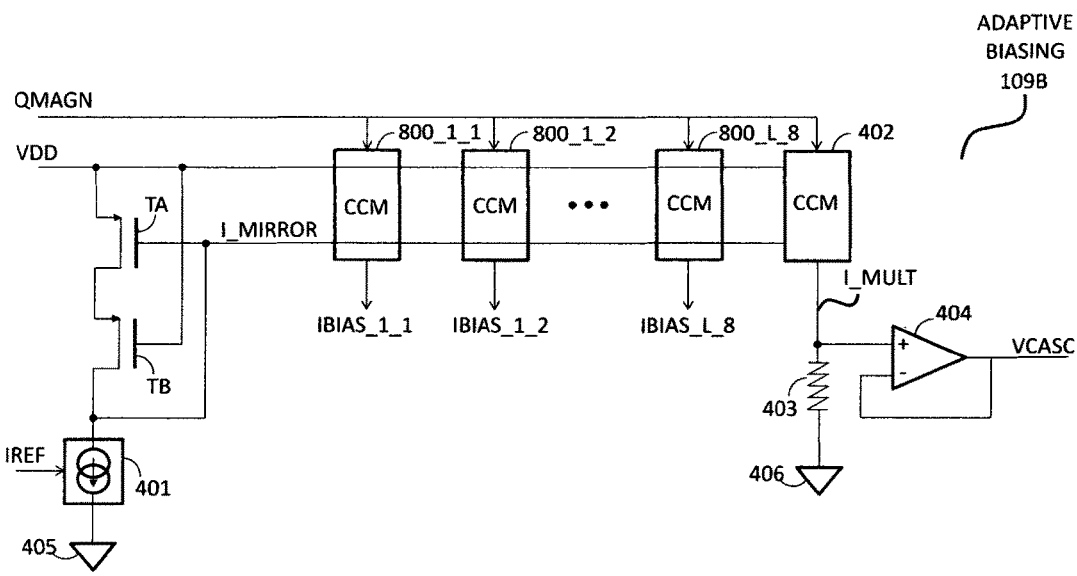
FIG. 8 shows the details of the adaptive biasing circuit of the invention embodiment in FIG. 5.

FIG. 8 shows another exemplary diagrammatic representation of the adaptive biasing circuit 109B receiving as input the K-bit thermo-coded digital word QMAGN produced by circuit 110A. The circuit 109B comprises a current source 401 grounded on 405, a pair of transistors TA and TB, controlled current mirror (CCM) circuit 402, a resistor 403 grounded on 406 and an operational amplifier 404, collectively forming an electric network producing an output voltage value VCASC proportional to the input digital word QMAGN, as described in relation to FIG. 4. The adaptive biasing circuit 109B also comprises a multitude of 8×L controlled current mirror (CCM) circuits 800_1_1, 800_1_2, . . . , 800_L_8, all receiving as input the K-bit thermo-coded digital word QMAGN 402 and operating as 402 to produce 8×L analog output current bias signals IBIAS_1_1, IBIAS_1_2, . . . , IBIAS_L_8, collectively referred to as IBIAS.

Figure 9:
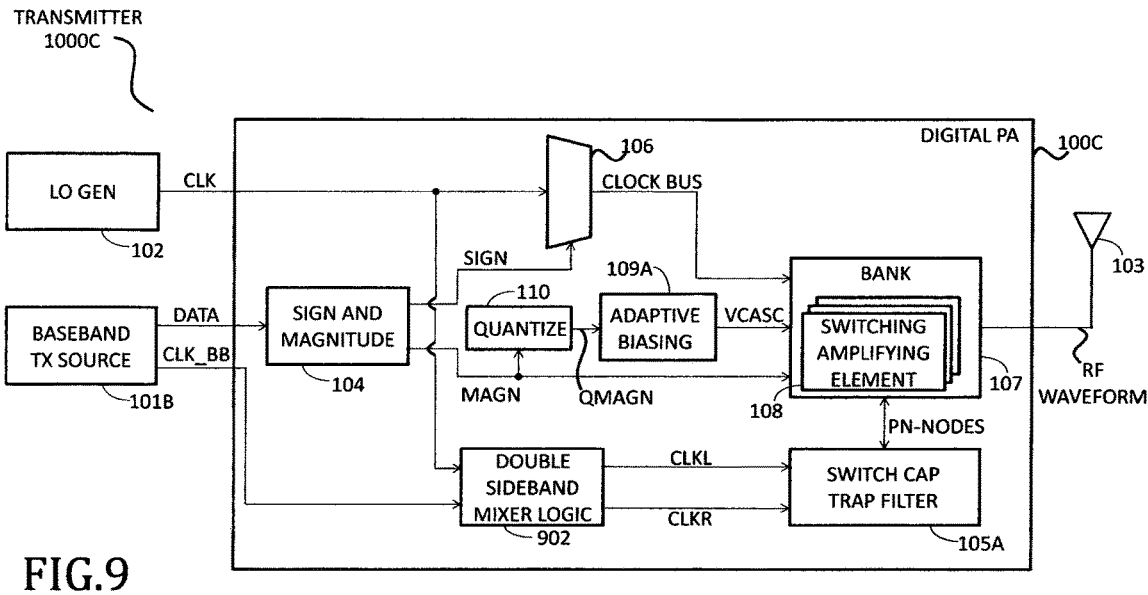
FIG. 9 shows another embodiment of the invention that employs a mixer logic.

FIG. 9 shows another embodiment of the invention employing a DPA circuit 100C, where a double sideband mixer logic 902 receives as input the clock CLK of frequency FC and a baseband clock signal CLK_BB and it produces as output a pair of clock signals CLKL and CLKR. The clock signal CLK_BB is produced by the baseband TX source 101B and it has a frequency FS, same with the frequency of the information sequence DATA. The produced clock signals CLKL and CLKR have frequencies FC−FS and FC+FS respectively and they are fed to the switch capacitor trap filter 105A in order to drive the left side-band filter 302 and the right side-band filter 301 respectively. In this way, the switch capacitor trap filter 105A introduces two band-stop frequency regions around the two frequencies FC−FS and FC+FS symmetrically placed with respect to FC. The clock signals CLKL and CLKR may be differential signals comprising mirrored components CLKL-P, CLKL-N and CLKR-P, CLKR-N.

The double sideband mixer logic 902 may also be used in conjunction with the switch capacitor trap filter 105B in order to drive the left side-band filter 602 and the right side-band filter 601 respectively.

Figure 10:
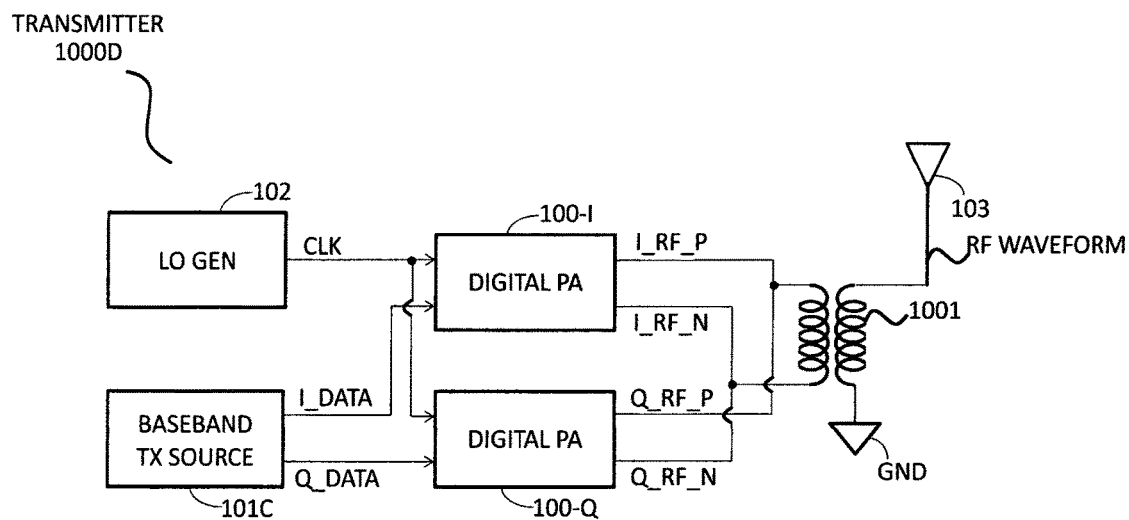
FIG. 10 shows an embodiment of the invention applicable to complex IQ information sequence.

FIG. 10 shows an exemplary diagrammatic representation of another embodiment of the invention. A transmitter 1000D is applicable to a complex information sequence formed by a real component I_DATA and an imaginary component Q_DATA, the circuit comprising a pair of DPA circuits 100-I and 100-Q, each DPA following the description in relation to FIG. 1. A baseband TX source 101C produces the complex information data sequence (I_DATA, Q_DATA), while a local oscillation signal generator (LO gen) 102 produces a clock signal CLK. The DPA 100-I circuit is fed with I_DATA and CLK and it produces a differential radio frequency (RF) signal with components I_RF_P and I_RF_N. The DPA 100-Q circuit is fed with Q_DATA and CLK and it produces a differential radio frequency signal with components Q_RF_P and Q_RF_N. The two differential RF signals are combined by a coupling circuit 1001 comprising pair of inductors for producing the RF waveform to be fed to the antenna 103. One port of the first inductor taps on both I_RF_P and Q_RF_P, while the other port of the first inductor taps on both I_RF_N and Q_RF_N. The second one is a grounded inductor producing the RF waveform.

Figure 11:
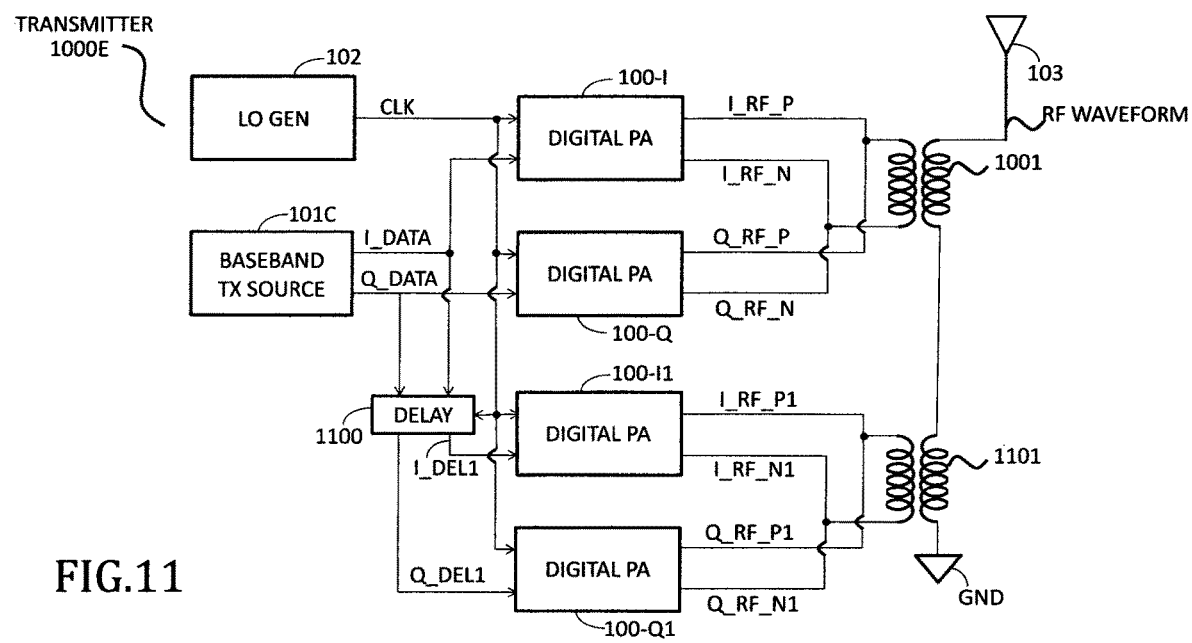
FIG. 11 shows an embodiment of the invention applicable to complex IQ information sequence also employing FIR filtering.

FIG. 11 shows an exemplary diagrammatic representation shows of another embodiment of the invention applicable to complex IQ information sequence also employing FIR filtering. A transmitter 1000E receives as input a complex information sequence (I_DATA, Q_DATA) fed to a pair of DPA circuits 100-I and 100-Q, as well as to the delay element 1100. The delay element 1100 produces as output a complex signal (I_DEL1, QDEL1) that is fed to a pair of DPA circuits 100-I1 and 100-Q1. The delay time in 1100 may be equal to 1/FS. The output ports I_RF_P, I_RF_N and Q_RF_P, Q_RF_N of 100-I and 100-Q are differentially combined at the two ports of a first inductor of a coupling circuit 1001. The output ports I_RF_P1, I_RF_N1 and Q_RF_P1, Q_RF_N1 of 100-I1 and 100-Q1 are differentially combined at the two ports of a first inductor of a coupling circuit 1101. The second inductor of 1001 is connected in series with the second inductor of 1101. The serially connected inductors are grounded on one side and connected to the antenna 103 on the other side. This setup of the coupling circuits forms an inductive output combiner summing together the currents produced at the output ports of the DPA circuits in order to produce the RF waveform fed to the antenna. In this way, a finite impulse response (FIR) filtering structure employing addition in the RF domain can be combined with the switch capacitor trap filter 105 achieving a better filtering effect. The penalty for this better filtering is some loss of power efficiency.

The transmitter circuit may comprise a larger number of delay elements, for example three elements inducing delays equal to 1/FS, 2/FS and 3/FS. So, in the case of employing a complex information sequence, four pairs of DPA circuits will be needed. In this setup, the filtering efficiency is further favored at the cost of additional power efficiency.

INDUSTRIAL APPLICABILITY

The invention enables the application of the DPA methodology on millimeter wave signaling (20 GHz to 60 GHz), while it allows energy savings in applications using lower carrier frequencies. The invented circuit can be implemented in low-cost technology such as a CMOS technology, allowing low cost, high efficiency PA solutions that can be used in numerous commercial applications, including the Internet of Things (IoT), Wi-Fi and 5G cellular communications.

What is claimed is:

1. An apparatus for performing the task of a Digital Power Amplifier (DPA) circuit receiving as input an information data sequence with certain sampling frequency FS and producing an RF waveform with frequency content around a carrier frequency FC, where the sampling frequency FS is lower than the carrier frequency FC, comprising:
    a bank of switching amplifying elements controlled by the information data sequence;
    a double sideband mixer logic producing a pair of clock signals with frequencies FC+FS and FC−FS;
    a switch capacitor trap filter taping on the bank of switching amplifying elements, said switch capacitor trap filter receiving as input the pair of clock signals with frequencies FC+FS and FC−FS for creating two band-stop frequency regions around of the frequencies FC+FS and FC−FS; and
    an adaptive biasing circuit responsive to the information data sequence producing a voltage used for dynamically controlling the power consumption within the switching amplifying elements.

2. The DPA circuit in claim 1, wherein,
    the switching amplifying element comprises a pair of transistor circuits connected in series and an AND gate;
    the first transistor is a cascode transistor receiving a dynamically variable voltage at its gate controlling the current flowing through the pair of transistors;
    the AND gate receives as a first input a clock signal running at the carrier frequency FC and as a second input one bit of the input data in thermo-coded representation; and
    the gate of the second transistor is fed with the output of the AND gate in order to switch on and off the flow of the current as this is adjusted by the cascode transistor.

3. The DPA circuit in claim 1, wherein the adaptive biasing circuit also produces a multitude of bias currents which control gyrators comprising the switch capacitor trap filter.

4. The DPA circuit in claim 2, wherein,
    the switch capacitor trap filter comprises a capacitor, an inductor and a quadruple of switches, collectively forming an electric network exhibiting a band-stop frequency response (notch);
    the capacitor taps on the node connecting the pair of transistors within the switching amplifying elements;
    the quadruple of switches forms a ring structure and the switches are controlled by a differential clock; and
    the values of the capacitor, the inductor and the frequency of the differential clock are chosen so that the notch is centered around a desired frequency value.

5. The DPA circuit in claim 2, wherein,
    the adaptive biasing circuit receives as input a K-bit thermo-coded digital word and comprises a current source, a pair of transistors connected in series, a controlled current mirror circuit (CCM) and an operational amplifier, collectively forming an electric network producing an output voltage value proportional to the input digital word;
    the controlled current mirror circuit comprises K pairs of transistors connected in series, where the gates of all the first transistors of each of the K pair of transistors are connected together and the gate of each one of the K second transistors of each of the K pair of transistors is switched on and off in response to one of the K bits of the input digital word;
    the current source generates a current fed to the gates of the K first transistors in CCM; and
    the output voltage value is produced by the operational amplifier connected in buffer configuration, in response to the current flowing through all the K transistor pairs of CCM.

6. The DPA circuit in claim 3, wherein,
    the switch capacitor trap filter comprises an active inductance circuit;
    the active inductance circuit comprises two pairs of Gyrators connected in series,
    the two gyrators in each pair connected back to back; and
    each of the four gyrators is controlled by a bias current produced by the adaptive bias circuit.

7. The DPA circuit in claim 6, wherein each gyrator receiving as input a power-up control signal is a multitude of L identical gyrator circuit slices and produces as output a summation current, each gyrator circuit slice comprising:
    a current source controlled by a bias current produced by the adaptive bias circuit;
    a power down control circuit switching on and off the power on the gyrator circuit slice in response to the output of an and gate receiving as inputs the value of one bit in the L-bit thermo-coded digital control and the power-up control flag and;

a pair of transistors connected in series and producing an output current tapped on the connection point of the two transistors, contributing to the summation current.

8. The DPA circuit in claim 6, wherein, the adaptive biasing circuit receives as input a K-bit thermo-coded digital word and comprises a current source, a pair of transistors connected in series, a multitude of controlled current mirror (CCM) circuits and an operational amplifier, collectively forming an electric network producing an output voltage value proportional to the input digital word, and L analog current bias signals;

the current source generates a current distributed to the CCM circuits;

each CCM circuit receives as input the K-bit input digital word and produces as output an analog current bias signal; and the operational amplifier is connected in buffer configuration it receives as input the analog current bias signal produced by one CCM circuit and it produces as output a voltage value.

9. A transmitter circuit receiving as input a complex information data sequence formed by a real component and an imaginary component, said circuit comprising a pair of the DPA circuits in claim 1, wherein the first DPA circuit is fed with the real component and the second DPA circuit is fed with the imaginary component.

10. A transmitter circuit comprising, a plurality of the DPA circuits in claim 1;

a plurality of delay elements, each delay element fed with the information data sequence and being attached to the input of a DPA circuit so each DPA circuit receives as input a potentially delayed version of the information data sequence; and an inductive output combiner summing together the currents produced at the output ports of the DPA circuits.

* * * * *